(12) United States Patent
Dortu et al.

(10) Patent No.: US 6,252,443 B1
(45) Date of Patent: Jun. 26, 2001

(54) DELAY ELEMENT USING A DELAY LOCKED LOOP

(75) Inventors: Jean-Marc Dortu, Munich (DE); Albert M. Chu; Frank Ferraiolo, both of Essex, VT (US)

(73) Assignees: Infineon Technologies North America, Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/295,157

(22) Filed: Apr. 20, 1999

(51) Int. Cl.[7] ....................................................... H03L 7/06
(52) U.S. Cl. ........................ 327/156; 327/149; 327/158; 327/161; 327/276
(58) Field of Search ................................... 327/262, 270, 327/276, 277, 278, 280, 284, 392, 393, 155, 156, 158, 161, 149, 150, 152, 153, 159

(56) References Cited

U.S. PATENT DOCUMENTS

| | | | |
|---|---|---|---|
| 5,146,121 | * 9/1992 | Searles et al. | 327/276 |
| 5,218,314 | * 6/1993 | Efenndovich et al. | 327/149 |
| 5,295,164 | * 3/1994 | Yamamura | 327/159 |
| 5,594,376 | * 1/1997 | McBride et al. | 327/149 |
| 5,602,884 | * 2/1997 | Wieczorkiewicz et al. | 327/156 |
| 5,717,353 | * 2/1998 | Fujimoto | 327/276 |
| 5,744,991 | * 4/1998 | Jefferson et al. | 327/158 |
| 5,875,219 | * 2/1999 | Kim | 327/155 |
| 6,005,426 | * 12/1999 | Lin et al. | 327/158 |
| 6,043,694 | * 3/2000 | Dortu | 327/156 |
| 6,069,507 | * 5/2000 | Shen et al. | 327/156 |
| 6,087,868 | * 7/2000 | Millar | 327/156 |

\* cited by examiner

*Primary Examiner*—Kenneth B. Wells
*Assistant Examiner*—Paul Dinh
(74) *Attorney, Agent, or Firm*—Donald B. Paschburg

(57) ABSTRACT

A delay locked loop circuit, in accordance with the invention, includes a delay line for providing a delay through the delay line in accordance with a control signal, the delay line being connected across an input node and an output node. A delay element is connected to the input node, the delay element for providing a predetermined delay value to an input signal from the input node to provide a delayed input signal. A phase comparator is connected to the output node and the delay element for comparing phase differences between an output signal and the delayed input signal and for outputting the control signal to the delay line such that the delay line provides the predetermined delay value to the delay line across the input and output nodes.

22 Claims, 5 Drawing Sheets

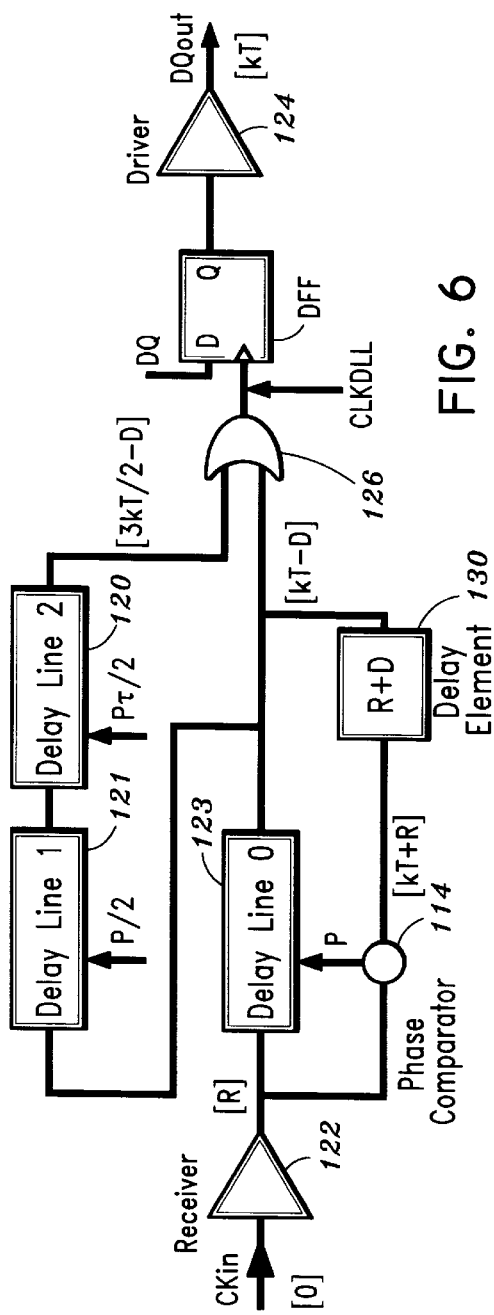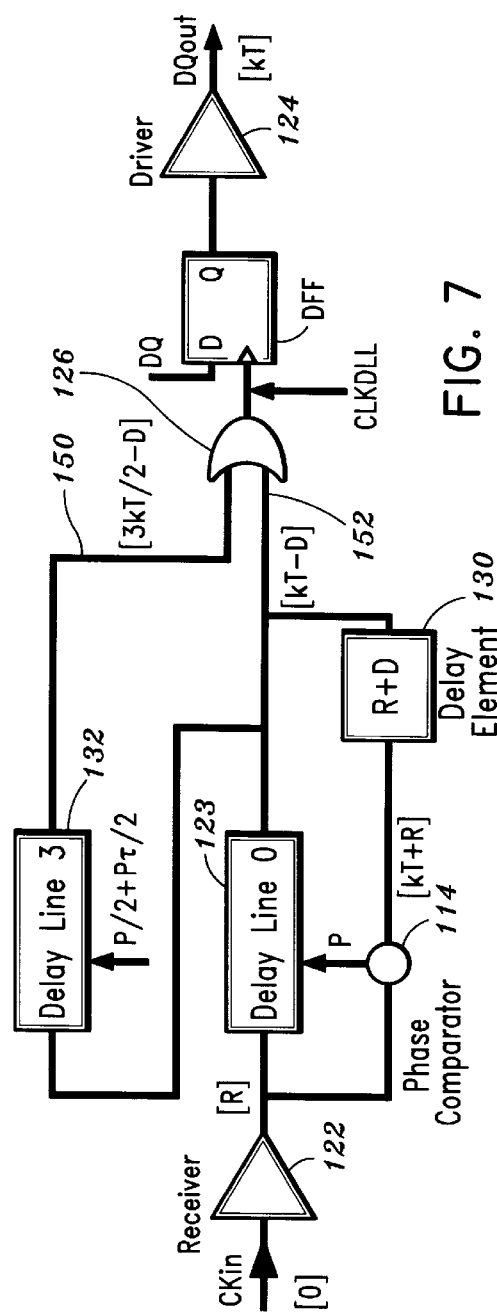

DELAY ELEMENT USING A DELAY LOCKED LOOP

BACKGROUND

1. Technical Field

This disclosure relates to delay circuitry and more particularly, to a delay element using a delay locked loop to generate digital pointers for matching delays in other circuits.

2. Description of the Related Art

Delay locked loops (DLL) are employed to compare a periodic signal input signal with an output signal. In this way a phase difference between the signals can be set to about zero. Referring to FIG. 1, a conventional DLL 10 is shown. An input signal CKin is input to a delay line 12 and a phase comparator 14. An output signal CKout is compared with input signal CKin by employing phase comparator 14. Phase comparator 14 sets or adjusts delay line 12 to provide a zero phase difference between the input and output signals. Delay line 12 stabilizes when the delay between input CKin and output CKout signals reaches a clock period T or a multiple thereof (kT, where k is a natural number). DLL 10 may be employed to synchronize an input clock to an output clock on a given integrated circuit, for example.

Referring to FIG. 2, an application of a DLL is shown. DLL 20 includes delays introduced by a receiver 22 and by a driver 24. These delays are compensated for by a delay element 26. Delay element 26 provides a delay compensation of τ in a feedback loop where τ=R+D. R is the delay introduced by receiver 22, and D is the delay introduced by driver 24. Input and output clocks, CKin and CKout, respectively, are synchronized when their phase difference becomes 2 kπ, that is, when the delay between input and output signals is equal to a multiple of the clock period, i.e., kT. Then, phase comparator 14 detects no phase difference between its two inputs 25 and 27. Input 25 has a delay of R compared to input clock (CKin). Input 27 has a delay of kT+R compared to input clock (CKin), where T is the clock period. In the case shown and described with respect to FIG. 2, the delay line control signal (pointer) 30 is adjusted until inputs 25 and 27 are in sync.

Referring now to FIG. 3, a more specific use for a DLL is illustrated. A circuit 40 is employed to synchronize an output data stream DQout. Output data DQ is latched in a D Flip Flop (DFF) by a DLLCLK signal. The delay is the sum of receiver delay R, driver delay D and the delay introduced by Flip Flop DFF.

Referring to FIG. 4, circuit 40 of FIG. 3 can be adapted to provide double data rate output using the DLL to multiply the clock frequency by 2. A DLL system 50 produces a clock signal with a double frequency of the input clock such that the output data (DQout) is in phase with the input clock (CKin) as described above. To perform this, two clock signals are derived from input clock signal CKin. The first derived signal has a delay of kT−D where D is the sum of delays of an OR gate 52, flip-flop DFF and output driver 24. The second derived clock signal has a delay of (3 kT/2)−D. Both the first and second derived clock signals are input to OR gate 52. For the second derived signal, a second delay line 54 is employed which is controlled by a pointer P/2 (having half the value of a pointer P controlling delay line 12 from phase comparator 14. A delay element 57 is introduced to provide delay to input 53. In this case, the DLL is digital, which means that pointer P may be divided by two by dropping the least significant bit (LSB). This ensures that the delay caused by delay line 54 is half the delay introduced by delay line 12.

The delay introduced by delay line 12 is kT−D−R. The delay introduced by delay line 54 is (kT−D−R)/2. So the delay of the signal incoming at an input 53 of OR gate 52 is (kT−D)+(kT−D−R)/2+(R+D)/2=(3kT/2)−D. This ensures the generation of the second clock on input 53 with a phase shift of 180 degrees to the first clock on input 55.

A problem related to DLL system 50 is that it is difficult to track delay elements for all the process and temperature variations of the receiver and the driver circuits. It is even more difficult to generate another circuit tracking, in the same manner, half of this delay to provide the double data rate.

Therefore, a need exists for a delay element including a delay locked loop which provides better tracking of delays introduced in the circuit. A further need exists for a delay locked loop circuit to provide tracking a half delay clock signal.

SUMMARY OF THE INVENTION

A delay locked loop circuit, in accordance with the invention, includes a delay line for providing a delay through the delay line in accordance with a control signal, the delay line being connected across an input node and an output node. A delay element is connected to the input node, the delay element for providing a predetermined delay value to an input signal from the input node to provide a delayed input signal. A phase comparator is connected to the output node and the delay element for comparing phase differences between an output signal and the delayed input signal and for outputting the control signal to the delay line such that the delay line provides the predetermined delay value to the delay line across the input and output nodes.

In alternate embodiments, the control signal is preferably a digital signal. The control signal may be transmitted to other circuits. The control signal may be arithmetically processed to provide an altered control signal capable of providing delays to other delay lines which are proportional to the control signal. The delay line may include transistors which are controlled by the control signal. The input signal is preferably a clock signal. The delay locked loop may include a register for storing to store the control signal.

Another delay locked loop circuit includes an input node for receiving a delayed input signal. A first delayed locked loop has a first delay line connecting between the input node and a first node. A first delay element connects to the first node and to a first phase comparator, the first phase comparator for providing a first control signal that sets a delay in the first delay line. The first delay element includes a second delay locked loop which further includes a second delay line for providing a delay through the second delay line in accordance with a second control signal.

The second delay line is connected to the first phase comparator and the first node. The second delayed locked loop also includes a second delay element connecting to the input node. The second delay element provides a predetermined delay value to a first node signal from the first node to provide a delayed first node signal. A second phase comparator is connected to the first phase comparator and the second delay element for comparing phase differences between an output from the second delay line and the delayed first node signal. The second phase comparator outputs the second control signal to the second delay line such that the second delay line outputs the predetermined delay value and compensates for a delay between the input node and the first node through the first delay line.

In alternate embodiments, the second control signal is preferably a digital signal. The delay locked loop circuit may include a third delay line connecting to the first node, the third delay line for providing a fraction of the predetermined delay value, the third delay line providing the fraction of the predetermined delay value by being controlled by an arithmetically altered signal of the second control signal thereby compensating for physical variations in delay for the second and third delay lines. The delay locked loop circuit may further include an OR gate for logically combining an output of the third delay line and signals on the first node such that a clock rate output from the OR gate is modified from the input signal. In one embodiment, the arithmetically altered signal is one half the sum of the first and second control signals, and the delay in the third delay line is one half the delays of the sum of the first and second delay lines. The delay locked loop may include a register for storing the second control signal, performing arithmetic operations and transmitting the second control signal and arithmetically altered portions thereof to other circuits. The second delay element may include passive devices which simulate circuit delays before and after the delayed locked loop.

Further, a clock circuit is also described in accordance with the present invention which includes, inter alia, a third delay line which is connected to the first node, the third delay line for providing a fraction of the predetermined delay value, the third delay line providing the fraction of the predetermined delay value by being controlled by an arithmetically altered signal of the second control signal thereby compensating for physical variations in delay for the second and third delay lines. An OR gate is included for logically combining an output of the third delay line and signals on the first node such that a clock rate output from the OR gate is modified from the input signal. A flip flop is also include which is enabled by the clock rate to permit data transfer through the flip flop to a driver.

In alternate embodiments of the clock circuit, a register may be included for storing the second control signal, for performing arithmetic operations and for transmitting the second control signal and arithmetically altered portions thereof to other circuits. The second control signal is preferably a digital signal. In one embodiment, the arithmetically altered signal is one half the sum of the first and second control signals and the delay in the third delay line is one half the delays of the sum of the first and second delay lines, the clock output from the OR gate being substantially equal to two times a clock input at the input node. The second delay element may include passive devices which simulate circuit delays of the receiver, the OR gate, the flip flop and the driver.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 6 is a schematic diagram of one embodiment of the present invention showing a delay line replacing a delay element shown in FIG. 4;

FIG. 7 is a schematic diagram of another embodiment of the present invention showing delay lines and pointers of FIG. 6 combined;

DETAILED DESCRIPTION OF PREFERRED EMBODIMENTS

This disclosure relates to delay circuitry and more particularly, to a delay element using a delay locked loop to generate digital pointers to provide matched delay. The present invention employs the digital pointers in other portions of the same circuit and in other circuits to provide control signals for introducing appropriate delays in the circuits. The present invention provides a pointer corresponding to a delay $\tau$ such that a delay line is controlled by the pointer to yield a predefined delay, $\tau$. Further, the pointer may be employed to control a delay element having exactly half the value of a first delay element across all the process and temperature range variations.

Figure 5:
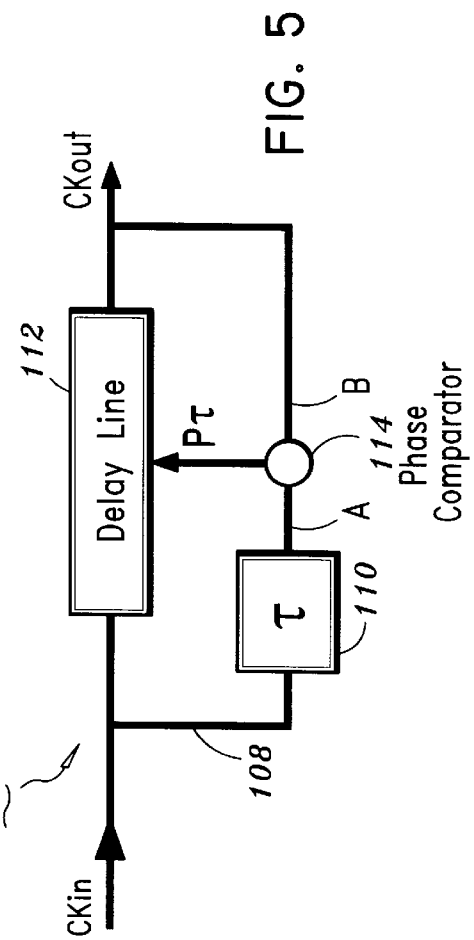
FIG. 5 is a schematic diagram of a delay locked loop for pointer generation in accordance with the present invention.

Referring now in specific detail to the drawings in which like reference numerals identify similar or identical elements throughout the several views, and initially to FIG. 5, a delay locked loop (DLL) 100 in accordance with the present invention is shown. An input signal CKin is input to a delay line 112 and a delay element 110. Delay element 110 is advantageously provided between input line 108 and phase comparator 114. Phase comparator 114 includes circuitry, for example logic circuitry, which analyzes nodes A and B to compare them. An output signal CKout is compared with input signal CKin by employing phase comparator 114. Phase comparator 114 sets or adjusts delay line 112 to provide a zero phase difference between the input and output signals. To perform this, the delay in delay line 112 is increased to a delay substantially equal to $\tau$ to synchronize delays between nodes A and B. Delay line 112 stabilizes when the delay between input CKin and output CKout signals substantially reaches $\tau$. As shown in FIG. 5, a pointer P$\tau$ is generated by phase comparator 114 for controlling delay line 112 such that delay line 112 provides a predefined delay $\tau$. In this way a pointer P$\tau$ may be employed in various parts of a circuit to produce the predefined delay. This aspect of the invention eliminates the need for predefined hardware such as calibrated delay elements which include delay for specific elements or groups of elements. In other embodiments, the pointer may be varied to provide different delays across the circuit. For example a pointer $P_\tau$ provides a delay of $\tau$ while a pointer $P_\tau/2$ yields a delay of $\tau/2$.

The delay locked loop 100 may be employed in various areas of an integrated circuit chip. In a preferred embodiment, $P_\tau$ is a digital signal. In this way, $P_\tau$ may be transmitted to various areas of a chip to adjust and set delays in various delay lines, etc. The present invention will now be described in greater detail by way of a non-limiting example.

Figure 1:
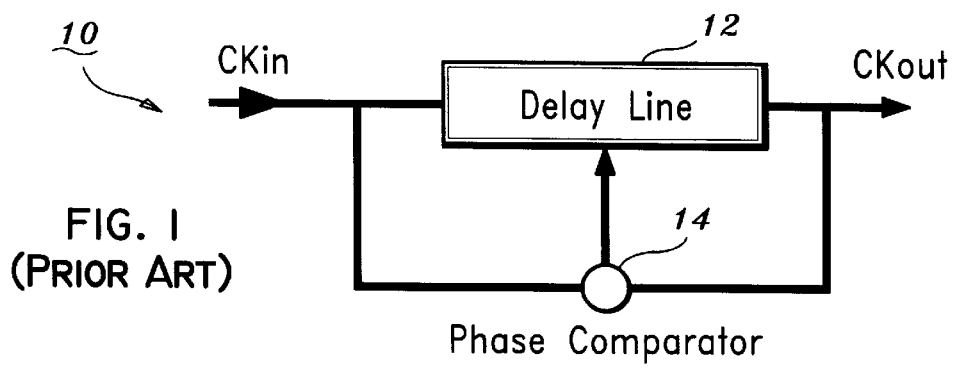
FIG. 1 is a schematic diagram of a prior art delay locked loop.
Figure 2:
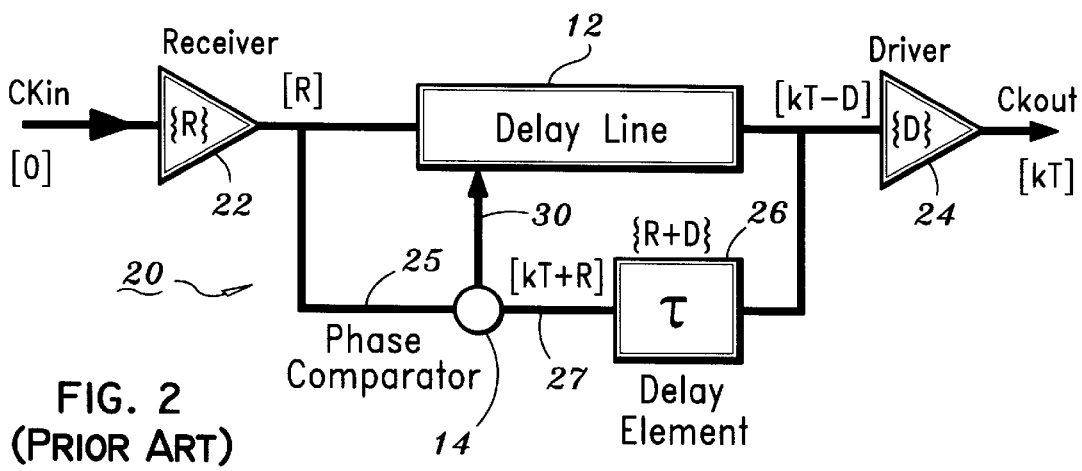
FIG. 2 is a schematic diagram of a prior art delay locked loop having a delay element representing delays introduced by circuit components.
Figure 3:
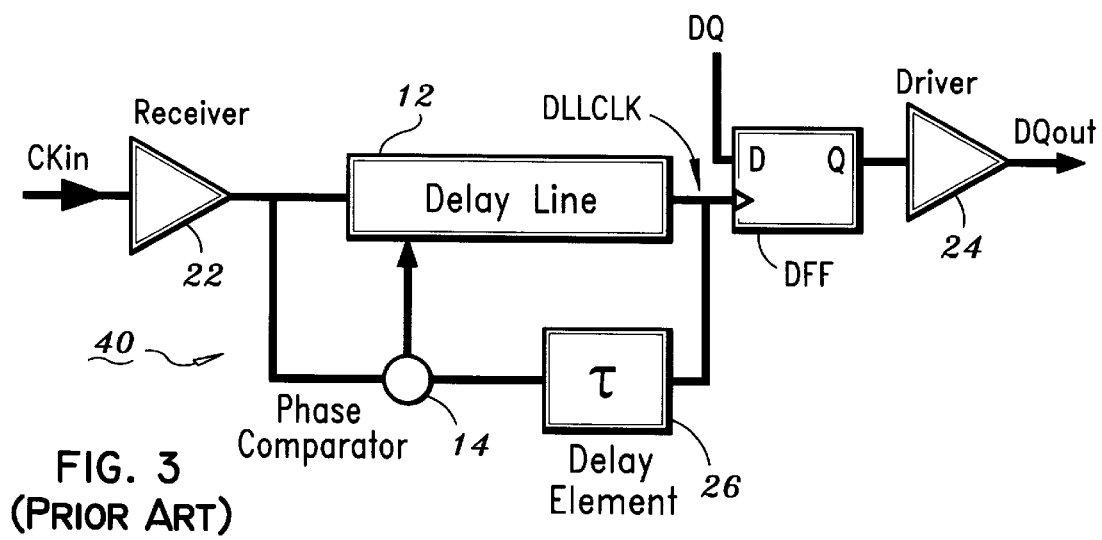
FIG. 3 is a schematic diagram of a prior art delay locked loop for providing a clock signal to a flip-flop for latching data.
Figure 4:
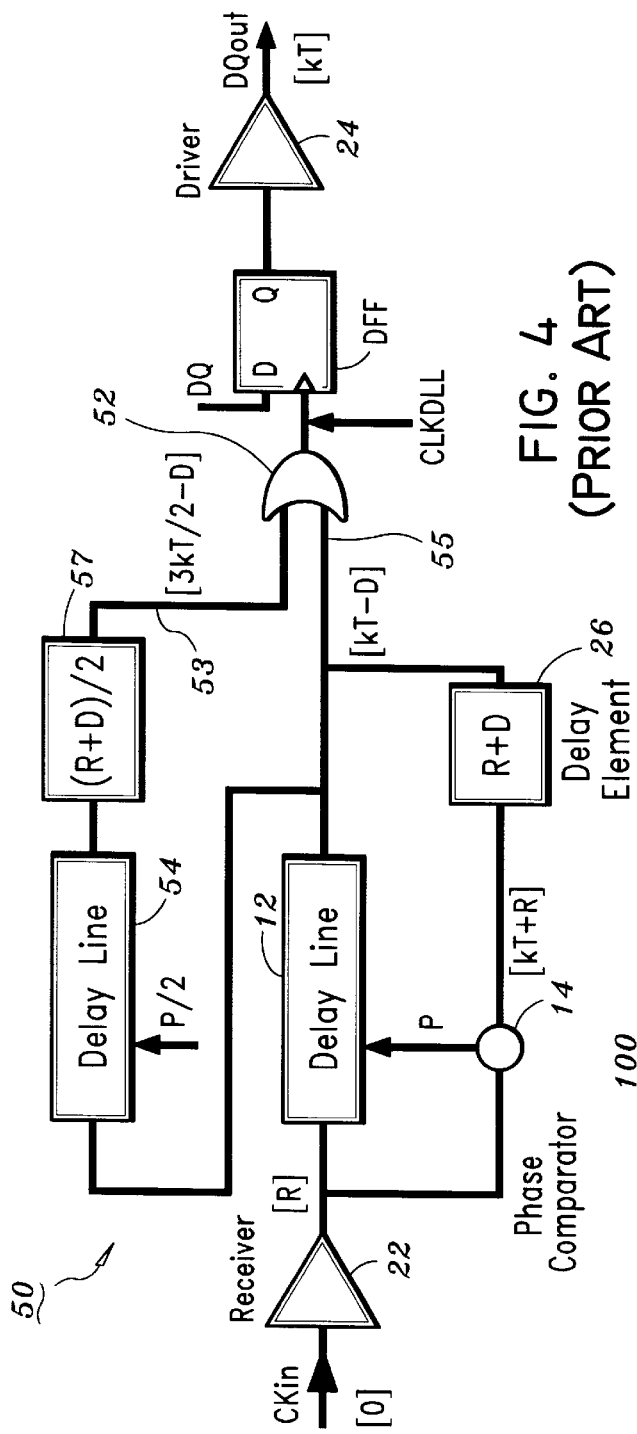
FIG. 4 is a schematic diagram of a prior art delay locked loop circuit for providing a double clock signal to a flip-flop for latching data.

Referring to FIG. 6, in an example of the present invention, the circuit of FIG. 4, has delay element 57 replaced by a delay line 120. A DLL circuit such as DLL 100 (FIG. 5) may be employed to provide a pointer PT. Delay line 120 receives a pointer $P_\tau/2$ where $\tau$ is R+D and R represents the delay introduced by a receiver 122, and D is the delay introduced by a driver 124, D flip-flop DFF and OR gate 126. A circuit, as shown in FIG. 5 may be used to provide pointer $P_\tau$ for providing a delay $\tau$ in a delay line. In one embodiment, the pointer $P_\tau$ is a digital signal. A delay of $\tau/2$ may be provided by dropping off the least significant bit of $P_\tau$ to get $P_\tau/2$. $P_\tau/2$ is employed to control delay line 120 such that a delay is provided therein equal to $\tau/2$. Delay line 120 advantageously provides a delay element that tracks the delay of a delay element (delay line 112 of FIG. 5), for example having a delay of $\tau$ as shown in FIG. 5, through all variations and temperature ranges. In other words, delay line 120 will be one half the delay of $\tau$. A delay line 121 is employed to provide one half the delay of a delay line 123. Delay line 123 is controlled by pointer P which is generated by phase comparator 114. Delay line 121 is controlled by P/2 which may be arithmetically provided by dividing by two.

Referring to FIG. 7, another implementation of the present invention is shown. A combined delay line 132 may be employed to provide an appropriate delay. In accordance with the invention, two or more delay lines may be combined by providing an appropriate sized delay line and controlling the delay line with a summation of pointer signals. This may be performed by logically combining, for example adding the signals to provide a combined pointer signal which controls delay line 132. Delay lines 120 and 121 (FIG. 6) are combined and a pointer signal equal to $P/2+P_\tau/2$ is included to control delay line 132. P/2 is a pointer which generates one half of the delay in a delay line 112 as provided by phase comparator 114. Inputs 150 and 152 to OR gate 126 are delayed by (3 kT/2)–D and kT–D, respectively. However, in accordance with the invention, the delays are compensated for temperature and other variations as described above. Advantageously, the present invention provides a more stable delay and half delay tracking by implementing DLL 100 of FIG. 5. DLL 100 of FIG. 5 generates the pointers which provide exact delay values needed by delay lines. Since, the pointers from phase comparator are used in multiple places and are preferably digital, the delays and half delays are compensated for automatically thereby providing better clock signals and a true double clock rate.

Figure 8:
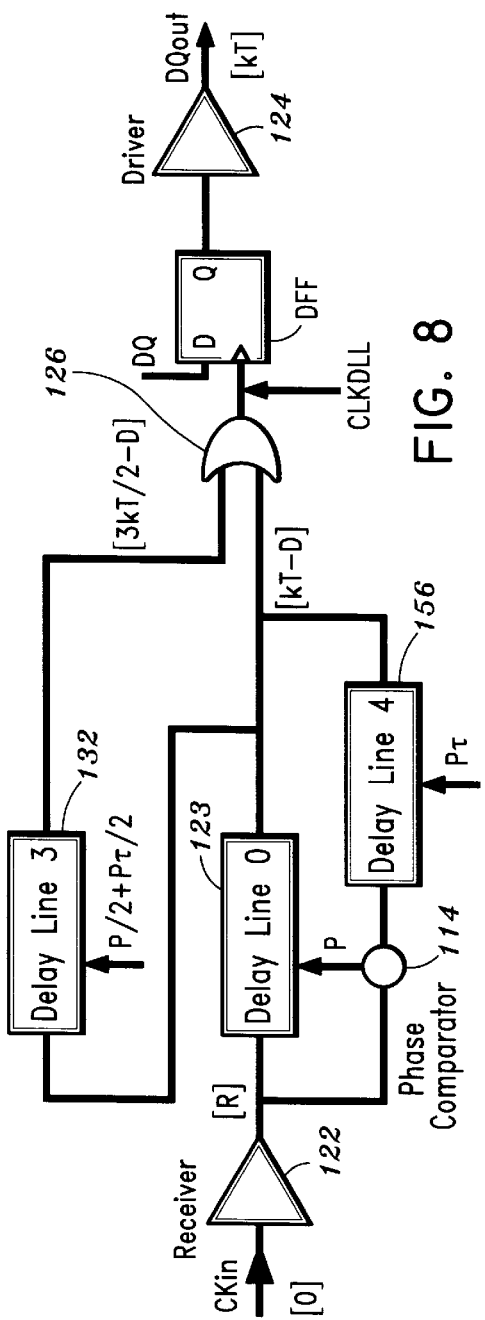
FIG. 8 is a schematic diagram of another embodiment of the present invention showing a delay line replacing a delay element shown in FIG. 7, the delay lines being controlled by P.

Referring to FIG. 8, a preferred embodiment of the present invention is shown. Delay element 130 is replaced by a delay line 156. Delay line 156 receives a pointer $P_\tau$. In accordance with the invention, $P_\tau$ may be received from another area of an integrated circuit where $P_\tau$ is generated in accordance with FIG. 5. $P_\tau$ is preferably digital to permit arithmetic operation to be easily performed. For example, a divide by 2 operation to generate $P_\tau/2$ for delay line 132. Other arithmetic operations may by performed including multiplication, addition and subtraction to alter $P_\tau$.

Figure 9:
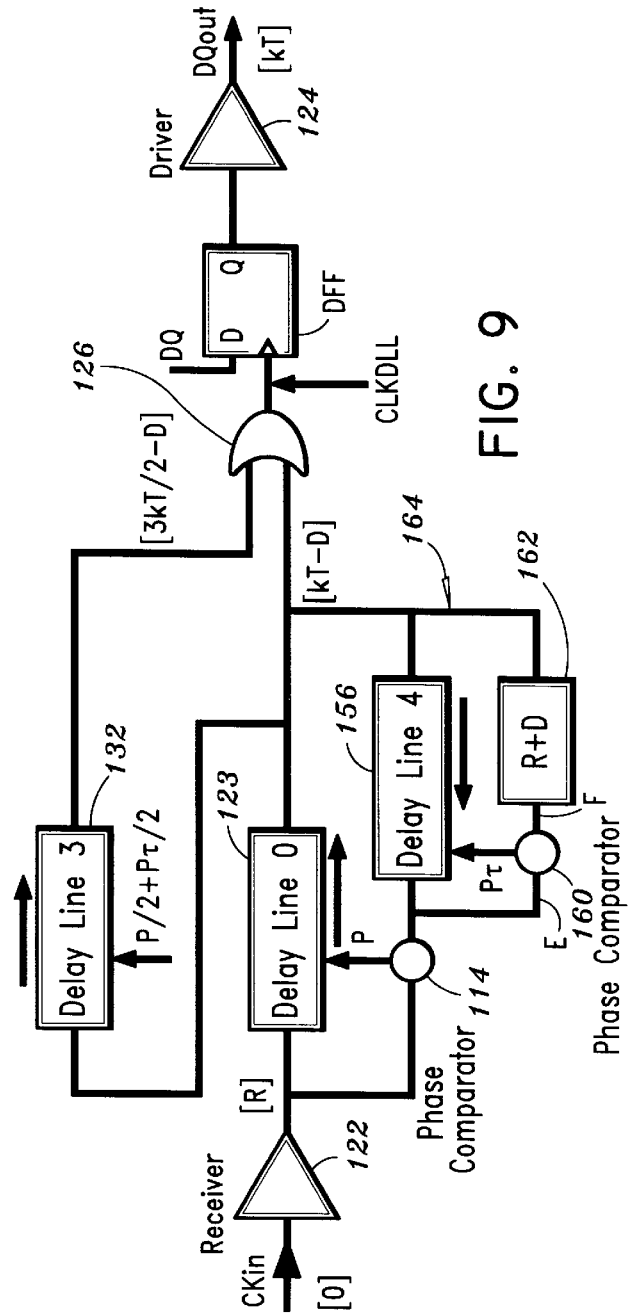
FIG. 9 is a schematic diagram of another embodiment of the present invention showing a delay element replaced by a delay locked loop of FIG. 5.

Referring to FIG. 9, another preferred embodiment of the present invention is shown. FIG. 9 shows the circuit of FIG. 8 having a $P_\tau$ pointer generation circuit as in FIG. 5. As described above, a phase comparator 160 compares delays at nodes E and F to provide a pointer or control signal to delay line 156. A delay element 162 provides a delay of R+D=$\tau$ where R and D are described above. This generates $P_\tau$ in accordance with the invention as explained with reference to FIG. 5 above. Advantageously, the present invention provides a delay locked loop 164 for a delay element.

Figure 10:
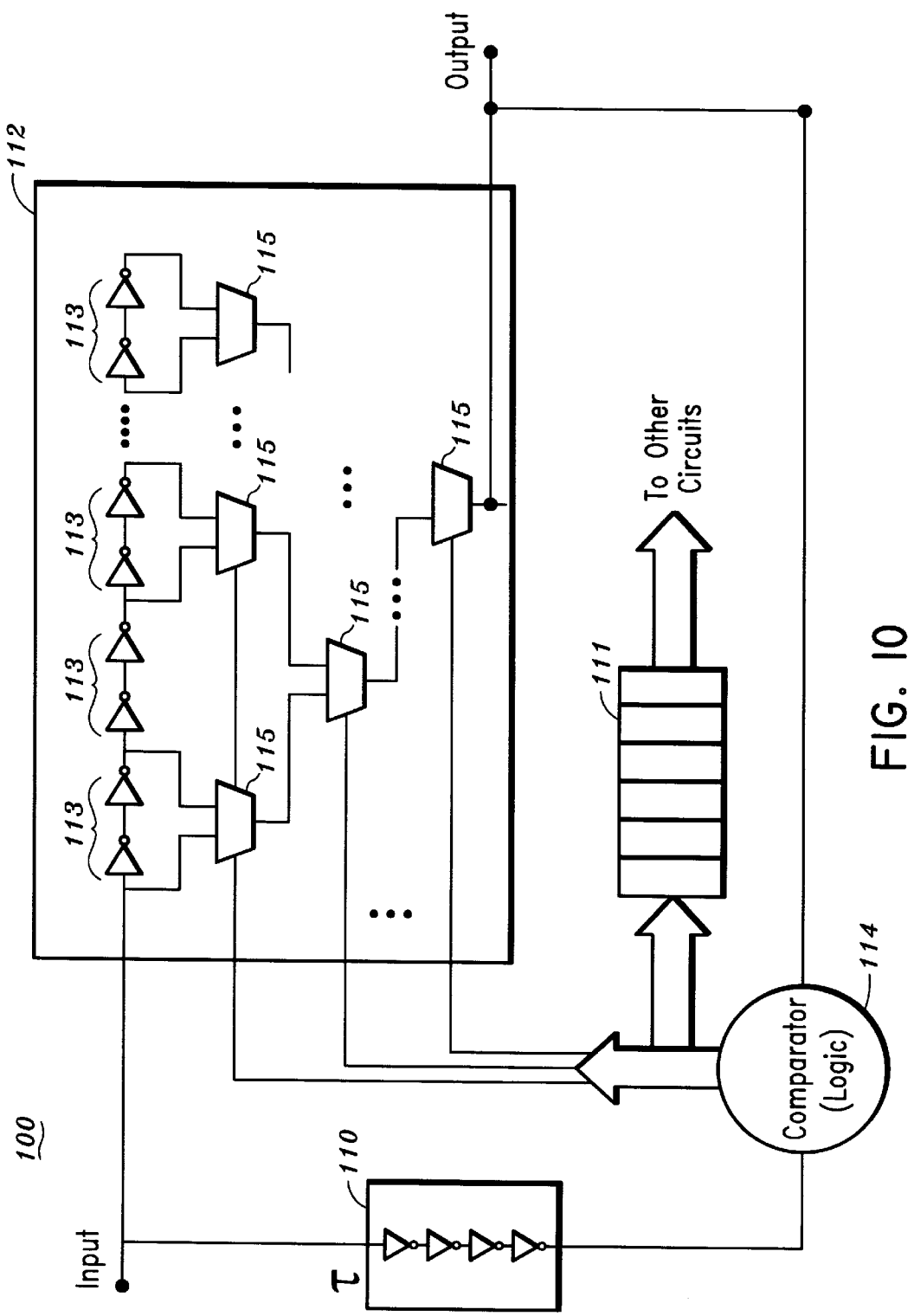
FIG. 10 is a schematic diagram showing the delay locked loop of FIG. 5 in greater detail in accordance with the present invention.

Referring to FIG. 10, an illustrative example of a DLL 100 is illustratively shown. DLL 100 includes a delay line 112 which includes one or more invertors 113. Invertors 113 are connected between an input and an output of DLL 100. Invertors 113 are preferably activated through a plurality of multiplexers 115 which are controlled by a digital pointer $P_\tau$. Pointer $P_\tau$ is used to activate a predetermined number of invertors 113 to vary the delay in delay line 112. Delay element 110 may include passive elements such as capacitors and resistors connected to provide an RC time constant ($\tau$) equal to the desired delay. In a preferred embodiment, delay element includes invertors. Delay element 110 is advantageously provided between the input and phase comparator 114. Phase comparator 114 includes circuitry, such as logic circuitry, to compare signals from the input through delay element 110 and the output to adjust a pointer signal $P_\tau$ in accordance with a discrepancy between the compared signals. $P_\tau$ may be input to a register or through logic circuitry 111 to perform arithmetic operations as described above.

The present invention has now been described by way of example for an integrated circuit for a memory chip. However, the present invention is broader and may be employed in processors chips, embedded dynamic random access memories (DRAMs), application specific integrated circuits (ASICs) or other circuits which need delay compensation or tracking.

Having described preferred embodiments for a novel delay element using a delay locked loop (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A delay locked loop circuit comprising:

a delay line which provides a delay through the delay line in accordance with a digital control signal, the delay line being connected across an input node and an output node;

a delay element connecting to the input node, the delay element providing a predetermined delay value to an input signal from the input node to provide a delayed input signal; and a phase comparator connected to the output node and the delay element to compare phase differences between an output signal and the delayed input signal and to output the digital control signal to the delay line such that the delay line delays the input signal across the input and output nodes in accordance with the digital control signal, wherein the digital control signal is arithmetically processed to provide an altered control signal for providing delays to other delay lines which are proportional to the digital control signal.

2. The delay locked loop as recited in claim 1, wherein the digital control signal is transmitted to other circuits.

3. The delay locked loop as recited in claim 1, wherein the delay line includes transistors, which are controlled by the digital control signal.

4. The delay locked loop as recited in claim 1, wherein the input signal is a clock signal.

5. The delay locked loop as recited in claim 1, further comprising a register for storing the digital control signal.

6. A delay locked loop circuit comprising:
   an input node for receiving a delayed input signal;
   a first delayed locked loop having a first delay line connecting to the input node and to a first node;
   a first delay element connecting to the first node and to a first phase comparator, the phase comparator for providing a first control signal for setting a delay of the first delay line;
   the first delay element including a second delay locked loop, further comprising:
      a second delay line for providing a delay through the second delay line in accordance with a second control signal, the second delay line being connected to the first phase comparator and the first node;
      a second delay element connecting to the input node, the second delay element for providing a predetermined delay value to a first node signal from the first node to provide a delayed first node signal; and
      a second phase comparator connected to the first phase comparator and the second delay element for comparing phase differences between an output from the second delay line and the delayed first node signal, the second phase comparator for outputting the second control signal to the second delay line such that the second delay line outputs the predetermined delay value and compensates for a delay between the input node and the first node through the first delay line.

7. The delay locked loop circuit as recited in claim 6, wherein the second control signal is a digital signal.

8. The delay locked loop circuit as recited in claim 6, further comprising:
   a third delay line connecting to the first node, the third delay line for providing a fraction of the predetermined delay value, the third delay line providing the fraction of the predetermined delay value by being controlled by an arithmetically altered signal of the second control signal thereby compensating for physical variations in delay for the second and third delay lines.

9. The delay locked loop circuit as recited in claim 8, further comprising:
   an OR gate for logically combining an output of the third delay line and signals on the first node such that a clock output from the OR gate is modified from the input signal.

10. The delay locked loop as recited in claim 8, wherein the arithmetically altered signal is one half the sum of the first and second control signals and the delay in the third delay line is one half the delays of the sum of the first and second delay lines.

11. The delay locked loop as recited in claim 6, further comprising a register for storing the second control signal, performing arithmetic operations and transmitting the second control signal and arithmetically altered portions thereof to other circuits.

12. The delay locked loop as recited in claim 6, wherein the second delay element includes passive devices which simulate circuit delays before and after the delayed locked loop.

13. A clock circuit comprising:
   an input node for receiving a delayed input signal from a receiver;
   a first delayed locked loop having a first delay line connecting to the input node and to a first node;
   a first delay element connecting to the first node and to a first phase comparator, the phase comparator for providing a first control signal for setting a delay of the first delay line, the first phase comparator connecting to the input node;
   the first delay element including a second delay locked loop, further comprising:
      a second delay line for providing a delay through the second delay line in accordance with a second control signal, the second delay line being connected to the first phase comparator and the first node;
      a second delay element connecting to the input node, the second delay element for providing a predetermined delay value to a first node signal from the first node to provide a delayed first node signal; and
      a second phase comparator connected to the first phase comparator and the second delay element for comparing phase differences between an output from the second delay line and the delayed first node signal, the second phase comparator for outputting the second control signal to the second delay line such that the second delay line outputs the predetermined delay value and compensates for a delay between the input node and the first node through the first delay line;
   a third delay line connects to the first node, the third delay line for providing a fraction of the predetermined delay value, the third delay line providing the fraction of the predetermined delay value by being controlled by an arithmetically altered signal of the second control signal thereby compensating for physical variations in delay for the second and third delay lines;
   an OR gate for logically combining an output of the third delay line and signals on the first node such that a clock output from the OR gate is modified from the input signal; and
   a flip flop enabled by the clock rate to permit data transfer through the flip flop to a driver.

14. The clock circuit as recited in claim 13, further comprising a register for storing the second control signal, for performing arithmetic operations and for transmitting the second control signal and arithmetically altered portions thereof to other circuits.

15. The clock circuit as recited in claim 13, wherein the second control signal is a digital signal.

16. The clock circuit as recited in claim 13, wherein the arithmetically altered signal is one half the sum of the first and second control signals and the delay in the third delay line is one half the delays of the sum of the first and second delay lines, the clock output from the OR gate being substantially equal to two times a clock input at the input node.

17. The clock circuit as recited in claim 13, wherein the second delay element includes passive devices which simulate circuit delays of the receiver, the OR gate, the flip flop and the driver.

18. A delay locked loop circuit comprising:
   a delay line which provides a delay through the delay line in accordance with a control signal, the delay line being connected across an input node and an output node;

a delay element connecting to the input node, the delay element provides a predetermined delay value to an input signal from the input node to provide a delayed input signal; and a phase comparator connected to the output node and the delay element to compare phase differences between an output signal and the delayed input signal and to output the control signal to the delay line such that the delay line delays the input signal across the input and output nodes in accordance with the control signal, the control signal is transmitted to other circuits and is arithmetically processed to provide an altered control signal for providing delays to other delay lines which are proportional to the control signal.

19. The delay locked loop as recited in claim 18, wherein the control signal is a digital signal.

20. The delay locked loop as recited in claim 18, wherein the delay line includes transistors, which are controlled by the control signal.

21. The delay locked loop as recited in claim 18, wherein the input signal is a clock signal.

22. The delay locked loop as recited in claim 18, further comprising a register for storing the control signal.

* * * * *